(12) United States Patent
Hunter

(10) Patent No.: US 7,902,992 B2
(45) Date of Patent: Mar. 8, 2011

(54) STATUS INDICATOR

(75) Inventor: Phillip Hunter, Beaverton, OR (US)

(73) Assignee: Veris Industries, LLC, Portland, OR (US)

( * ) Notice: Subject to any disclaimer, the term of this patent is extended or adjusted under 35 U.S.C. 154(b) by 336 days.

(21) Appl. No.: 12/228,483

(22) Filed: Aug. 13, 2008

(65) Prior Publication Data

US 2009/0115400 A1    May 7, 2009

Related U.S. Application Data

(60) Provisional application No. 60/993,213, filed on Sep. 10, 2007.

(51) Int. Cl.
*G08B 21/00* (2006.01)

(52) U.S. Cl. ............... 340/664; 307/131; 324/772

(58) Field of Classification Search ........ 340/664, 340/538.16, 595, 646; 324/127, 772; 361/36, 361/37, 87, 93.6; 307/131; 374/183
See application file for complete search history.

(56) References Cited

U.S. PATENT DOCUMENTS

| | | | |
|---|---|---|---|
| 1,100,171 A | 6/1914 | Brown | |
| 1,455,263 A | 5/1923 | Oberfell | |
| 1,569,723 A | 1/1926 | Dickinson | |
| 1,800,474 A | 4/1931 | Scherer | |
| 1,830,541 A | 11/1931 | Harris | |
| 1,871,710 A | 8/1932 | Lenehan | |
| 2,059,594 A | 11/1936 | Massa, Jr. | |
| 2,411,405 A | 11/1946 | Yuhas | |
| 2,412,782 A | 12/1946 | Palmer | |
| 2,428,613 A | 10/1947 | Boyajian | |
| 2,428,784 A | 10/1947 | Cole | |
| 2,512,070 A | 6/1950 | Nelsen et al. | |
| 2,663,190 A | 12/1953 | Ilgenfritz | |
| 2,746,295 A | 5/1956 | Lubkin | |
| 2,802,182 A | 8/1957 | Godshalk et al. | |
| 2,852,739 A | 9/1958 | Hansen | |
| 2,943,488 A | 7/1960 | Strobel et al. | |
| 3,190,122 A | 6/1965 | Edwards | |
| 3,243,674 A | 3/1966 | Ebert | |
| 3,287,974 A | 11/1966 | Ciemochowski | |

(Continued)

FOREIGN PATENT DOCUMENTS

EP    1531334 A2    5/2005

(Continued)

OTHER PUBLICATIONS

Description of KT® 6300, 6400 Split-Core kW/kWH Transducers . . . . Enercept KT®, 1 page by Hawkeye® (by Veris Industries, Inc.), at least one year prior to filling date (1997) (unavailable month).

(Continued)

*Primary Examiner* — John A Tweel, Jr.
(74) *Attorney, Agent, or Firm* — Chernoff, Vilhauer, McClung & Stenzel

(57) ABSTRACT

The sensitivity and accuracy of a status indicator for sensing a current in an electrical circuit is improved by shifting the reference level of the transformer output to maximize the input signal to a precision voltage detector and by reducing the hysteresis of the status indicator by balancing the burden of the current transformer during the positive and negative alternations of the AC signal and by driving secondary loads with a voltage to current converter.

8 Claims, 4 Drawing Sheets

U.S. PATENT DOCUMENTS

| | | | |
|---|---|---|---|
| 3,374,434 A | 3/1968 | Perry | |
| 3,493,760 A | 2/1970 | Hoadley | |
| 3,512,045 A | 5/1970 | Sanger et al. | |
| 3,584,294 A | 6/1971 | Siwko | |
| 3,593,078 A | 7/1971 | Domshy et al. | |
| 3,696,288 A | 10/1972 | Carman | |
| 3,728,705 A | 4/1973 | Atkins | |
| 3,769,548 A | 10/1973 | Pardue | |
| 3,772,625 A | 11/1973 | Raupach | |
| 3,793,559 A * | 2/1974 | Ristuccia | 361/36 |
| 3,861,411 A | 1/1975 | Mitchell et al. | |
| 3,955,701 A | 5/1976 | Fisch | |
| 3,976,924 A | 8/1976 | Vanjani | |
| 4,001,647 A | 1/1977 | Klein et al. | |
| 4,001,758 A | 1/1977 | Esper et al. | |
| 4,007,401 A | 2/1977 | Kimmel | |
| 4,030,058 A | 6/1977 | Riffe et al. | |
| 4,048,605 A | 9/1977 | McCollum | |
| 4,096,436 A | 6/1978 | Cook et al. | |
| 4,107,519 A | 8/1978 | Bicek | |
| D249,883 S | 10/1978 | Collins | |
| 4,124,030 A | 11/1978 | Roberts | |
| 4,151,578 A | 4/1979 | Bell | |
| 4,158,217 A | 6/1979 | Bell | |
| 4,158,810 A | 6/1979 | Leskovar | |
| 4,177,496 A | 12/1979 | Bell et al. | |
| 4,198,595 A | 4/1980 | Milkovic | |
| 4,207,604 A | 6/1980 | Bell | |
| 4,215,278 A | 7/1980 | Barbier et al. | |
| 4,227,419 A | 10/1980 | Park | |
| 4,241,237 A | 12/1980 | Paraskevakos et al. | |
| 4,243,982 A * | 1/1981 | Yarbrough | 340/664 |
| 4,249,264 A | 2/1981 | Crochet et al. | |
| 4,250,449 A | 2/1981 | Shum | |
| 4,253,336 A | 3/1981 | Pietzuch | |
| 4,258,348 A | 3/1981 | Belfer et al. | |
| 4,297,741 A | 10/1981 | Howell | |
| 4,328,903 A | 5/1982 | Baars | |
| 4,354,155 A | 10/1982 | Speidel et al. | |
| 4,359,672 A | 11/1982 | Hart | |
| 4,362,580 A | 12/1982 | Kane et al. | |
| 4,363,061 A | 12/1982 | Vaerewyck et al. | |
| 4,371,814 A | 2/1983 | Hannas | |
| 4,373,392 A | 2/1983 | Nagamoto | |
| 4,384,289 A | 5/1983 | Stillwell et al. | |
| 4,386,280 A | 5/1983 | Ricaud et al. | |
| 4,388,668 A | 6/1983 | Bell et al. | |
| 4,393,714 A | 7/1983 | Schmidt | |
| 4,398,426 A | 8/1983 | Park et al. | |
| 4,408,175 A | 10/1983 | Nelson et al. | |
| 4,413,193 A | 11/1983 | Crockett | |
| 4,413,230 A | 11/1983 | Miller | |
| 4,426,673 A | 1/1984 | Bell et al. | |
| 4,432,238 A | 2/1984 | Tward | |
| 4,464,661 A * | 8/1984 | Redmond | 340/960 |
| 4,491,790 A | 1/1985 | Miller | |
| 4,495,463 A | 1/1985 | Milkovic | |
| 4,506,199 A | 3/1985 | Asche | |
| 4,558,310 A | 12/1985 | McAllise | |
| 4,558,595 A | 12/1985 | Kompelien | |
| 4,574,266 A | 3/1986 | Valentine | |
| 4,605,883 A | 8/1986 | Cockroft | |
| 4,621,532 A | 11/1986 | Takagi et al. | |
| 4,660,407 A | 4/1987 | Takami et al. | |
| 4,709,339 A | 11/1987 | Fernandes | |
| 4,739,229 A | 4/1988 | Heiler, Jr. | |
| 4,746,809 A | 5/1988 | Coleman et al. | |
| 4,754,365 A | 6/1988 | Kazahaya | |
| 4,757,416 A | 7/1988 | Wilkerson | |
| 4,758,962 A | 7/1988 | Fernandes | |
| 4,783,748 A | 11/1988 | Swarztrauber et al. | |
| 4,794,327 A | 12/1988 | Fernandes | |
| 4,808,910 A | 2/1989 | Kessi | |
| D301,331 S | 5/1989 | Rhodin | |
| 4,851,803 A | 7/1989 | Hahn | |
| 4,855,671 A | 8/1989 | Fernandes | |
| 4,874,904 A | 10/1989 | DeSanti | |
| 4,885,655 A | 12/1989 | Springer et al. | |
| 4,887,018 A | 12/1989 | Libert | |
| 4,890,318 A | 12/1989 | Crane et al. | |
| 4,926,105 A | 5/1990 | Mischenko et al. | |
| 4,939,451 A | 7/1990 | Baran et al. | |
| 4,944,187 A | 7/1990 | Frick et al. | |
| 4,956,588 A | 9/1990 | Ming | |
| 4,970,476 A | 11/1990 | Kitagawa | |
| 4,972,167 A | 11/1990 | Fujioka | |
| 4,985,761 A * | 1/1991 | Adams | 725/14 |
| 4,991,050 A | 2/1991 | Heberlein, Jr. et al. | |
| 4,992,709 A | 2/1991 | Griffin | |
| 4,999,575 A | 3/1991 | Germer | |
| 5,003,278 A | 3/1991 | May | |
| 5,014,908 A | 5/1991 | Cox | |
| 5,025,195 A * | 6/1991 | Reeves | 340/664 |
| 5,039,970 A | 8/1991 | Cox | |
| 5,051,601 A | 9/1991 | Atobe et al. | |
| 5,066,904 A | 11/1991 | Bullock | |
| 5,079,510 A | 1/1992 | Komatsu et al. | |
| D323,815 S | 2/1992 | Boutellier | |
| 5,099,193 A | 3/1992 | Moseley et al. | |
| 5,122,735 A | 6/1992 | Porter et al. | |
| 5,148,348 A | 9/1992 | White | |
| 5,196,784 A | 3/1993 | Estes, Jr. | |
| D335,488 S | 5/1993 | Suzuki et al. | |
| 5,223,790 A | 6/1993 | Baran et al. | |
| 5,267,122 A | 11/1993 | Glover et al. | |
| 5,296,819 A | 3/1994 | Kuroiwa et al. | |
| 5,311,138 A | 5/1994 | Ott et al. | |
| 5,317,274 A | 5/1994 | Nakagawa et al. | |
| 5,323,256 A | 6/1994 | Banks | |
| 5,337,206 A | 8/1994 | Kadah et al. | |
| 5,359,273 A | 10/1994 | Fluckiger | |
| D354,945 S | 1/1995 | Dellavecchia et al. | |
| 5,385,060 A | 1/1995 | Wang | |
| 5,391,983 A | 2/1995 | Lusignan et al. | |
| 5,397,970 A | 3/1995 | Rowlette et al. | |
| 5,410,920 A | 5/1995 | Westwick | |
| 5,426,360 A | 6/1995 | Maraio et al. | |
| 5,430,438 A | 7/1995 | Joos et al. | |
| 5,444,183 A | 8/1995 | Gehrs et al. | |
| 5,450,765 A | 9/1995 | Stover | |
| 5,467,012 A | 11/1995 | Nystrom | |
| 5,471,359 A | 11/1995 | Simpson et al. | |
| 5,473,234 A | 12/1995 | Richardson | |
| 5,502,374 A | 3/1996 | Cota | |
| 5,548,209 A | 8/1996 | Lusignan et al. | |
| 5,563,506 A | 10/1996 | Fielden et al. | |
| 5,568,059 A * | 10/1996 | Futsuhara et al. | 324/772 |
| 5,572,073 A | 11/1996 | Burgess et al. | |
| 5,578,927 A | 11/1996 | Perelle | |
| 5,592,989 A | 1/1997 | Lynn et al. | |
| 5,596,652 A | 1/1997 | Piatek et al. | |
| 5,604,315 A | 2/1997 | Briefer et al. | |
| 5,612,499 A | 3/1997 | Andrew et al. | |
| 5,677,476 A | 10/1997 | McCarthy et al. | |
| 5,705,989 A | 1/1998 | Cota et al. | |
| 5,712,558 A | 1/1998 | Saint-Cyr et al. | |
| 5,753,983 A | 5/1998 | Dickie et al. | |
| 5,784,249 A | 7/1998 | Pouliot | |
| 5,808,846 A | 9/1998 | Holce et al. | |
| 5,844,138 A | 12/1998 | Cota | |
| 5,861,683 A | 1/1999 | Engel et al. | |
| 5,880,677 A | 3/1999 | Lestician | |
| 5,880,918 A | 3/1999 | Horbelt et al. | |
| 5,905,439 A | 5/1999 | McIntyre | |
| 5,909,087 A | 6/1999 | Bryde et al. | |
| 5,920,190 A | 7/1999 | Peterson et al. | |
| 5,920,191 A | 7/1999 | Maniero et al. | |
| 5,922,939 A | 7/1999 | Cota | |
| 5,995,911 A | 11/1999 | Hart | |
| 6,005,760 A | 12/1999 | Holce et al. | |
| D419,964 S | 2/2000 | Holce et al. | |
| 6,020,702 A | 2/2000 | Farr | |
| 6,029,524 A | 2/2000 | Klauder et al. | |
| 6,044,430 A | 3/2000 | MacDonald | |
| 6,046,550 A | 4/2000 | Ference et al. | |
| 6,064,192 A | 5/2000 | Redmyer | |
| 6,091,023 A | 7/2000 | O'Donnell | |

| | | |
|---|---|---|
| 6,122,972 A | 9/2000 | Crider |
| 6,124,791 A | 9/2000 | Wolf |
| D431,534 S | 10/2000 | Holce et al. |
| 6,133,709 A | 10/2000 | Puchianu |
| 6,133,723 A | 10/2000 | Feight |
| 6,137,418 A | 10/2000 | Zuercher et al. |
| 6,146,109 A | 11/2000 | Davis et al. |
| 6,219,216 B1 | 4/2001 | Holce et al. |
| 6,236,949 B1 | 5/2001 | Hart |
| 6,269,317 B1 | 7/2001 | Schachner et al. |
| 6,308,140 B1 | 10/2001 | Dowling et al. |
| 6,330,516 B1 | 12/2001 | Kammeter |
| 6,331,821 B1 | 12/2001 | Holce et al. |
| 6,344,951 B1 | 2/2002 | Sato et al. |
| 6,351,206 B1 | 2/2002 | Schweiger et al. |
| 6,373,238 B2 | 4/2002 | Lewis et al. |
| 6,380,696 B1 | 4/2002 | Sembhi et al. |
| 6,384,946 B1 | 5/2002 | Pitsch et al. |
| 6,404,166 B1 | 6/2002 | Puchianu |
| 6,414,241 B1 | 7/2002 | O'Donnell |
| D466,078 S | 11/2002 | Bowman |
| 6,496,378 B2 | 12/2002 | Holce et al. |
| 6,504,357 B1 | 1/2003 | Hemminger et al. |
| 6,504,695 B1 | 1/2003 | Holce et al. |
| 6,549,859 B1 | 4/2003 | Ward |
| 6,591,482 B1 | 7/2003 | Fleege et al. |
| D478,313 S | 8/2003 | Bowman |
| 6,615,147 B1 | 9/2003 | Jonker et al. |
| 6,636,028 B2 | 10/2003 | Lavoie et al. |
| 6,657,424 B1 | 12/2003 | Voisine et al. |
| 6,724,600 B2 | 4/2004 | Holce et al. |
| 6,737,854 B2 | 5/2004 | Bruno et al. |
| 6,756,776 B2 | 6/2004 | Perkinson et al. |
| 6,774,803 B1 | 8/2004 | Tiffin |
| 6,809,509 B2 | 10/2004 | Bruno et al. |
| 6,815,942 B2 | 11/2004 | Randall et al. |
| 6,817,760 B2 * | 11/2004 | Mende et al. ................. 340/595 |
| 6,825,771 B2 | 11/2004 | Bruno et al. |
| 6,856,515 B2 | 2/2005 | Holce et al. |
| 6,861,683 B2 | 3/2005 | Rissing et al. |
| 6,871,827 B2 | 3/2005 | Petak et al. |
| 6,888,712 B2 | 5/2005 | Holce et al. |
| 6,889,271 B1 | 5/2005 | Germer et al. |
| 6,937,003 B2 | 8/2005 | Bowman et al. |
| 6,950,292 B2 | 9/2005 | Holce et al. |
| 6,988,043 B1 | 1/2006 | Randall |
| 7,006,934 B2 | 2/2006 | Jonker et al. |
| 7,053,497 B2 | 5/2006 | Sodemann et al. |
| 7,157,899 B2 | 1/2007 | Bruno |
| 7,161,345 B2 | 1/2007 | Bruno |
| 7,193,428 B1 | 3/2007 | Baron et al. |
| 7,212,930 B2 | 5/2007 | Bruno |
| 7,221,145 B2 | 5/2007 | Bowman et al. |
| 7,230,414 B2 | 6/2007 | Bruno |
| 7,239,810 B2 | 7/2007 | Seely et al. |
| 7,310,049 B2 | 12/2007 | Bowman |
| 7,312,686 B2 | 12/2007 | Bruno |
| 7,330,022 B2 | 2/2008 | Bowman et al. |
| 7,333,345 B2 | 2/2008 | Holce et al. |
| 7,336,193 B2 * | 2/2008 | Schillert et al. ................. 340/664 |
| 7,352,287 B2 | 4/2008 | Rupert |
| 7,359,809 B2 | 4/2008 | Bruno |
| 7,447,603 B2 | 11/2008 | Bruno |
| 2004/0227503 A1 | 11/2004 | Bowman et al. |
| 2005/0240362 A1 | 10/2005 | Randall |
| 2006/0085144 A1 | 4/2006 | Slota et al. |
| 2006/0164096 A1 | 7/2006 | Kwon |
| 2009/0115620 A1 | 5/2009 | Hunter |
| 2009/0295370 A1 | 12/2009 | Parker |

FOREIGN PATENT DOCUMENTS

JP     5083776     4/1993

OTHER PUBLICATIONS

Ganssie, "Interrupt Latency," Embedded.com, www.embedded.com/show Article..jhmtl?articleID=9900320, Aug. 26, 2004.

AT91M42800A Summary, "AT91 ARM Thumb Microcontrollers," Atmel, Feb. 2002.

* cited by examiner

STATUS INDICATOR

CROSS-REFERENCE TO RELATED APPLICATIONS

This application claims the benefit of U.S. Provisional App. No. 60/993,213, filed Sep. 10, 2007.

BACKGROUND OF THE INVENTION

The present invention relates to a device for monitoring electric current in a cable connecting a load and a power source.

Many industrial, commercial and residential environments incorporate large numbers of electrical loads that are widely distributed geographically and often located in sites where access is difficult. Many of these devices are small and draw very limited amounts of current, commonly less than 20 amps and, often, only a fraction of an amp. However, the operation of these loads, for example, fan motors or lights can be important to maintaining a safe environment or the successful completion of a process that may involve costly or hazardous equipment or materials. Monitoring the operation of these devices is complicated by their remoteness from the monitoring location and the remoteness of the controller for the device which is often equally remote from the device and the monitoring location. For example, while security or maintenance personnel may desire to monitor the operation of a building's lights from a central location, the lights of a commercial building are commonly controlled by switches, photo-detectors, or motion sensors located on the floor or in the room where the light is located. Likewise, an operator of an industrial process may desire to monitor the operation of a number of widely distributed devices, for example, the operation of a heater or a fan located in an air duct and controlled by a remotely located thermostatic sensor.

Remote signaling of the operating status of an electrical device is commonly provided by a status indicator comprising a current sensor including a current transformer that is electromagnetically coupled to a cable supplying power to the monitored electrical device or load and a current switch, responsive to the output of the current transformer, to conductively interconnect a pair of output terminals or, alternatively, disconnect the terminals. A relay enabling activation and deactivation of the load by a remotely located controller may be included in the same housing with the current sensor and the current switch. For example, Holce et al., U.S. Pat. No. 6,331,821, incorporated herein by reference, discloses a combination current sensor and relay that includes a pair of switched output terminals and a pair of light emitting diodes (LEDs) that signal whether the monitored circuit is open or a closed. Referring to FIG. 1, the primary winding 58 of a current transformer 60 is connected in series between a load 40 and a source of electric power 28. The primary winding may comprise a power cable that connects the load and the source of power or, as illustrated by Holce et al., may comprise a separate primary winding that is arranged to be connected in series between the load and the power source. The secondary winding 62 of the transformer provides a current or voltage signal representative of the current in the primary winding to a diode D9 which, in conjunction with a capacitor C3, comprises a half-wave voltage rectifier.

The DC output of the rectifier is the input to a precision voltage detector (PVD) 68. The precision voltage detector interconnects its input and its output as long as the input voltage (VDD), the rectifier output voltage, remains above a detection voltage. With the output of the precision voltage detector high, the transistor Q5 conducts and the light emitting diode (LED) D4 is illuminated signaling that current is flowing to the load. The high voltage at the gates of the transistors Q4A, Q4B causes the transistors Q4A and Q4B to conduct, shorting the output terminals 73, 74 which may be conductively connected to an annunciator at a remote monitoring station and/or a controller that controls the operation of the load by exerting a high or low voltage at the coil of a relay 56.

If the rectifier output voltage (VDD) at the input of the precision voltage detector drops below the detection voltage, indicating that current is not flowing to the load, the precision voltage detector interconnects the system ground voltage (VSS) to the output. When voltage at the output of the precision voltage detector is low, the transistor Q5 does not conduct causing the LED D4 to be extinguished and the LED D5 to be illuminated. A low voltage at the gates of the transistors Q4A, Q4B causes non-conductance of the transistors, opening the conductive path between the output terminals to provide a second signal to the monitoring station and/or controller indicating that no current is flowing in the monitored circuit. If the rectifier output voltage (VDD) rises again to a release voltage, the precision voltage detector reconnects the input voltage to its output and the transistors Q4A, Q4B and Q5 resume conducting, shorting the output terminals, illuminating the LED D4 and extinguishing the LED D5.

The precision voltage detector inherently includes hysteresis, that is the detection voltage that triggers the opening of the conductive path between the output terminals is not equal to the release voltage that enables closure of the conductive path between the output terminals. As a result, the current in the monitored circuit that causes the status indicator contacts open will be different than the current that causes the contacts close. Further, when the rectifier voltage approximates the detection voltage, the contacts may open when the power cable current fluctuates but not close following the fluctuation because the rectifier output voltage does not exceed the release voltage of the precision voltage detector. The hysteresis of the precision voltage detector is typically less than five percent of the device's detection voltage but the hysteresis of the status indicator can be substantially greater because the operation of other portions of the current sensor exacerbate the hysteresis of the precision voltage detector.

What is desired, therefore, is a status indicator having increased sensitivity and reduced hysteresis.

DETAILED DESCRIPTION OF PREFERRED EMBODIMENTS

Figure 2:
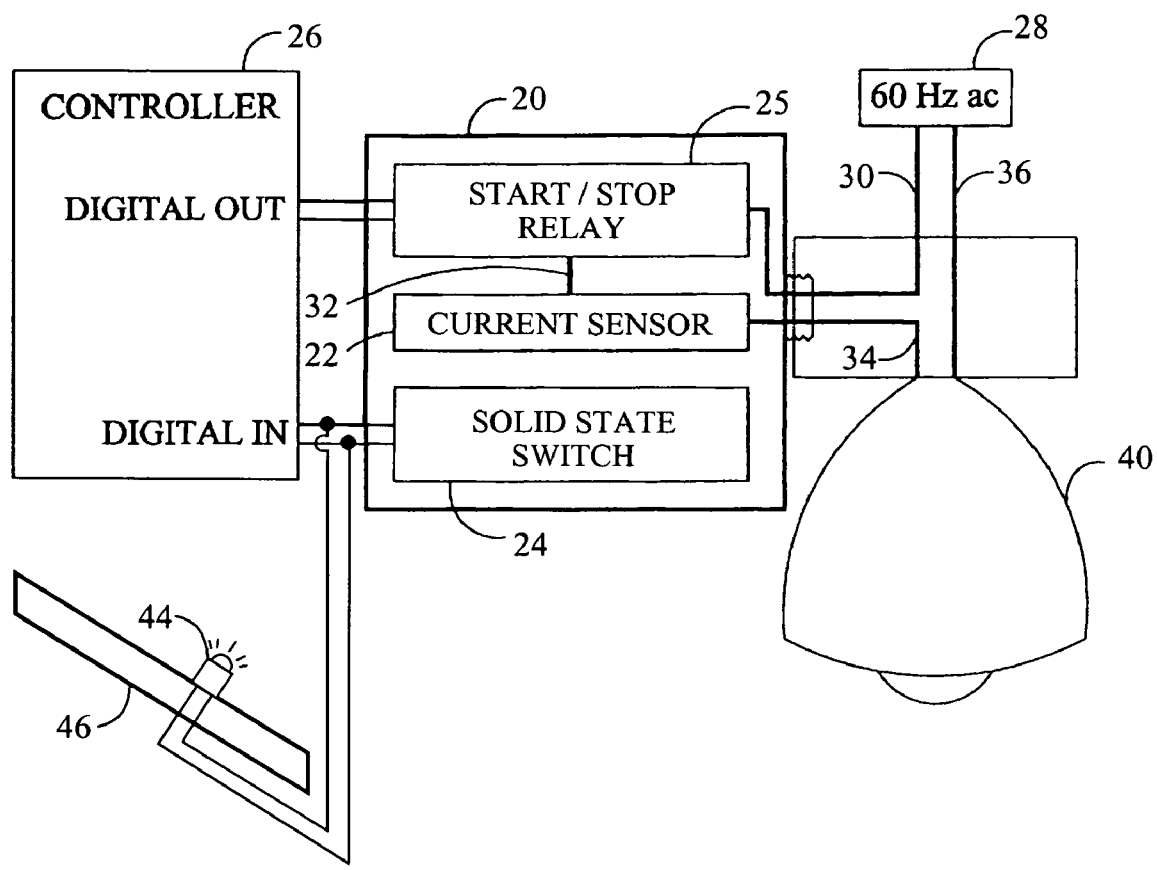
FIG. 2 is a block diagram of an electrical circuit including a status indicator.

Referring in detail to the drawings where similar parts are identified by like reference numerals, and, more particularly to FIG. 2, the operation of a remotely located electrical circuit is commonly monitored by a status indicator 20 that includes a current sensor 22 and a solid state switch 24 often in combination with a relay 25. The start/stop relay 25 is energized or otherwise controlled by a digital output of a controller 26 and is interconnected with a power source 28 by a wire 30. A conductive loop for current flow back to the power source includes the wire 32 interconnecting the relay and the current sensor, the wire 34 interconnecting the current sensor and the load 40, a light in the exemplary circuit, and the wire 36 interconnecting the load and the power source. When the start/stop relay is open, as a result of a control signal from the controller, the power to the load is interrupted (open circuit). Likewise, when the start/stop relay is closed, as a result of a second control signal from the controller, power is provided to the load (closed circuit). The status indicator includes a solid state current switch 24 that responds to a signal from the current sensor to provide a signal to the controller and/or an annunciator 44, such as an indicator light, at another remotely monitoring station 46 indicating that current is either flowing or not flowing in the monitored circuit. Typically, the current sensor outputs a signal representing the current flowing in a power cable of the monitored circuit. When the signal output by the current sensor attains a certain value, output terminals of the solid state switch are either conductively interconnected or disconnected to provide an appropriate signal to the remote monitor.

Figure 1:
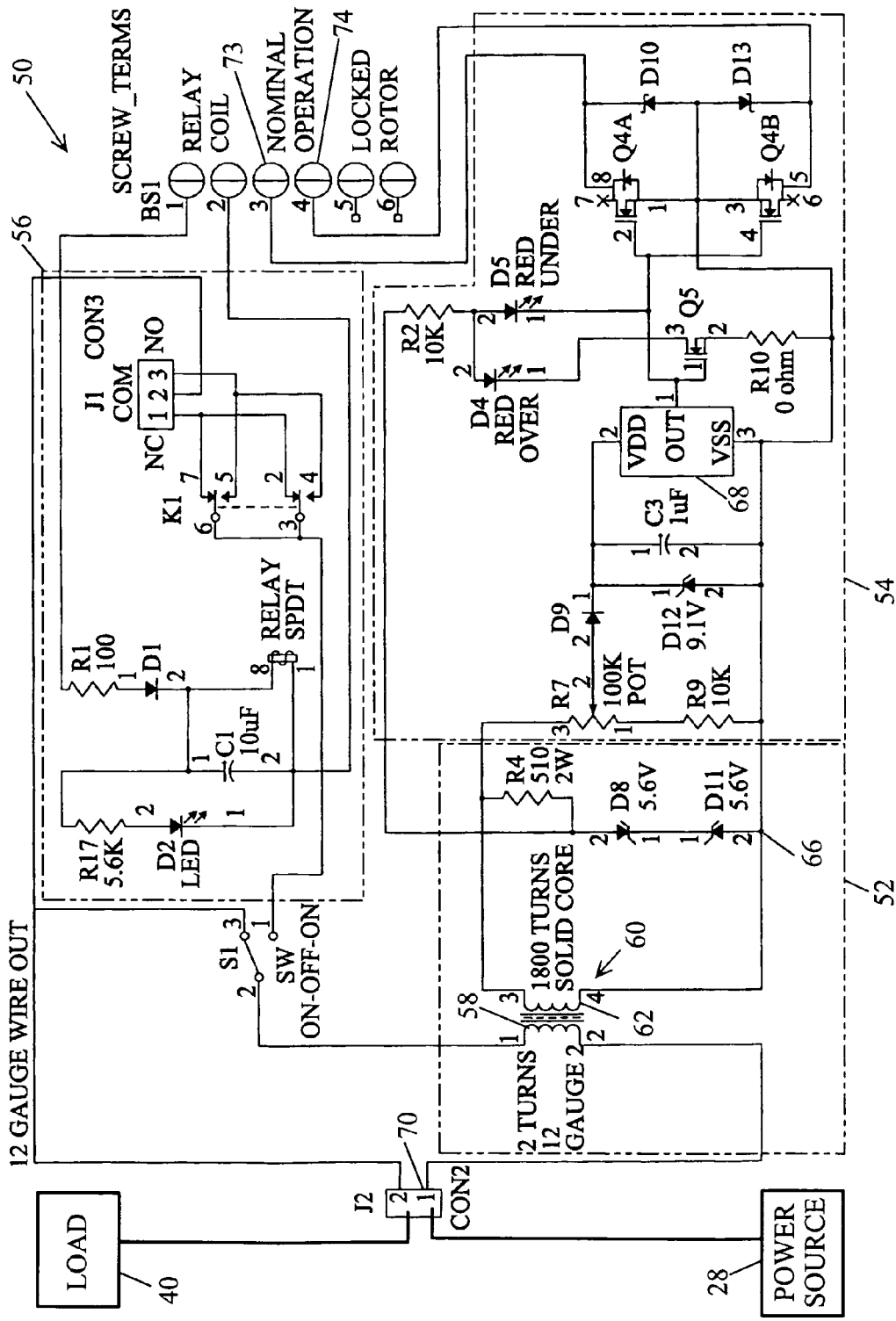
FIG. 1 is a schematic diagram of a prior art status indicator comprising a current sensor, a current switch and a relay.

Referring to FIG. 1, Holce et al., U.S. Pat. No. 6,331,821, discloses a status indicator 50 comprising a combination of a current sensor 52, a current switch 54 and a relay 56. The status indicator includes a pair of switched output terminals and a pair of light emitting diodes (LEDs), mounted on the status indicator's enclosure that signal whether or not current is flowing to the load in the monitored circuit. The current sensor comprises a current transformer 60 including a primary winding 58 connected in series between a load 40 and a power source 28. While the primary winding may comprise a power cable connecting the load and the power source, it may comprise a winding internal to the status indicator that is connected, at the terminals of a junction block 70, to power cables that interconnect the load and the power source. An alternating current in the primary winding of the current transformer induces a current or voltage signal in the secondary winding 62 of the transformer that is representative of the current in the primary winding. The burden of the transformer, a resistive load connecting the output terminals 64, 66 of transformer's secondary winding, comprises a pair of diodes D8 and D11 and the resistor R4 which produce a reference voltage at the upper terminal of the secondary winding. The pair of diodes D8, D11 also clip the alternating current in the secondary winding to protect the remaining portions of the circuit. A scaling resistor R9 and a potentiometer R7 regulate the voltage at the base of a diode D9 which in conjunction with a capacitor C3 comprises a half-wave voltage rectifier. The potentiometer enables adjustment of the relationship of the rectifier output voltage and the current in the primary winding. The diode D12 clamps the output of the rectifier limiting the maximum voltage of the rectifier's output.

Figure 3:
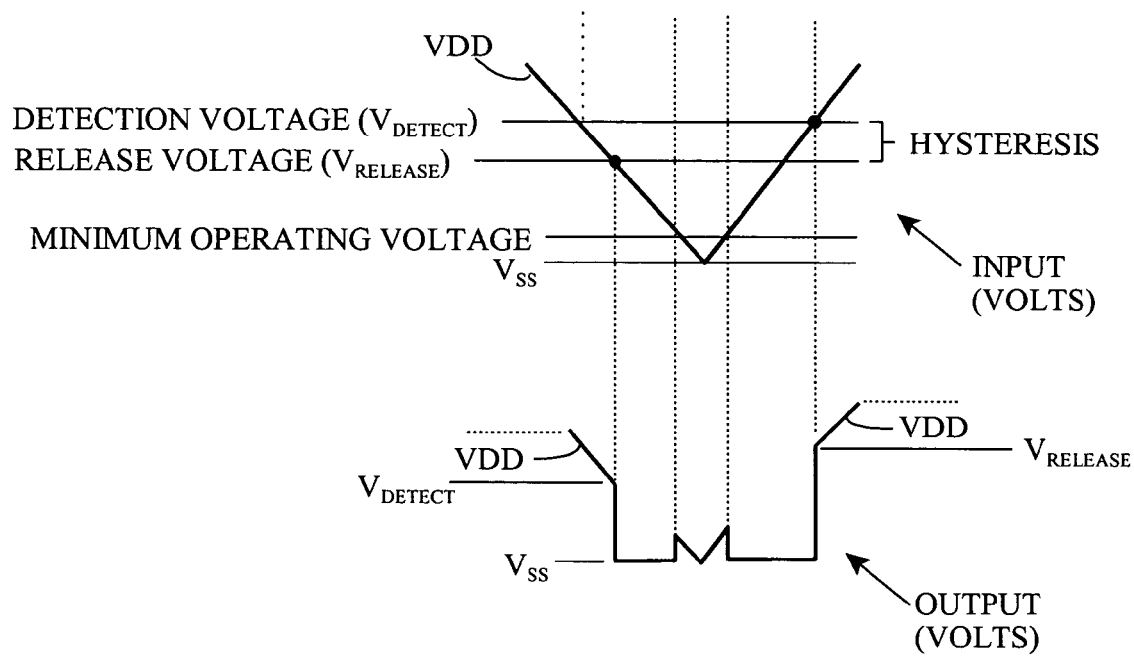
FIG. 3 is a graphic illustration of the operation of a precision voltage detector.

Referring also to FIG. 3, a precision voltage detector (PVD) 68 interconnects its input and its output as long as the input voltage (VDD), the rectifier output voltage, remains above a detection voltage ($V_{DETECT}$). With the output of the precision voltage detector high, the transistor Q5 conducts and a status indicator light, the light emitting diode (LED) D4, on the enclosure, is illuminated indicating that current is flowing to the load. The high voltage at the gates of the transistors Q4A, Q4B causes the transistors to conduct, shorting the output terminals 73, 74 which may be conductively connected to an annunciator at a remote monitoring station and/or a controller. The pair of diodes D10, D13 provides excess voltage protection for the output portion of the circuit.

If the rectifier output voltage (VDD), the input voltage to the precision voltage detector, drops below the detection voltage ($V_{DETECT}$), indicating that current is not flowing to the load, the precision voltage detector interconnects the system ground voltage (VSS) to the output. If the input voltage of the precision voltage detector drops even further, below a minimum operating voltage, the output voltage will be an indeterminate voltage somewhere between VDD and VSS. When voltage at the output of the precision voltage detector is low, the transistor Q5 does not conduct causing the LED D4 to be extinguished. On the other hand, the status indicator, LED D5, will be illuminated. With a low voltage at the gates of the transistors Q4A, Q4B, the transistors do not conduct, opening the interconnection between the output terminals to provide a second signal to the monitoring station and/or controller.

If the rectifier output voltage (VDD) rises again to a release voltage ($V_{RELEASE}$), the precision voltage detector reconnects the input voltage (VDD) to its output. With output of the precision voltage detector high, the transistors Q4A, Q4B and Q5 resume conducting, shorting the output terminals, illuminating the LED D4 and extinguishing the LED D5.

The precision voltage detector inherently includes hysteresis, that is, the detection voltage that triggers opening of the output terminals is not equal to the release voltage that causes shorting of the output terminals. As a result of the hysteresis of the precision voltage detector, there is a difference between the monitored circuit current that causes the status indicator to indicate an open circuit and the current that causes the status indicator to indicate that the monitored circuit is closed and operating but the hysteresis of the precision voltage indicator is limited, typically about five percent of the detection voltage. However, the hysteresis of the status indicator can be substantially greater than the hysteresis of the precision voltage detector because the operation of other parts of the status indicator circuit exacerbate the effects of the hysteresis of the precision voltage detector.

Current flows to the status LEDs D4, D5 from the secondary winding of the current transformer during the positive alternation of the alternating current (AC) signal in the winding. The imbalance in the burden on the current transformer between the positive and negative alternations introduces a DC offset in the AC waveform and can cause electromagnetic saturation of the core of the current transformer. In addition, the forward voltage through the status LED D4 is typically not the same as the forward voltage through the LED D5. As the respective LEDs are illuminated and extinguished, the burden of the secondary winding of the current transformer changes, effecting the output of the rectifier, and adding to the hysteresis of the precision voltage detector. The present inventor concluded that accuracy and repeatability of the status indicator could be improved by reducing the unbalanced nature of the status indicator circuit and increasing the magnitude of the voltage signal to the precision voltage detector.

Figure 4:
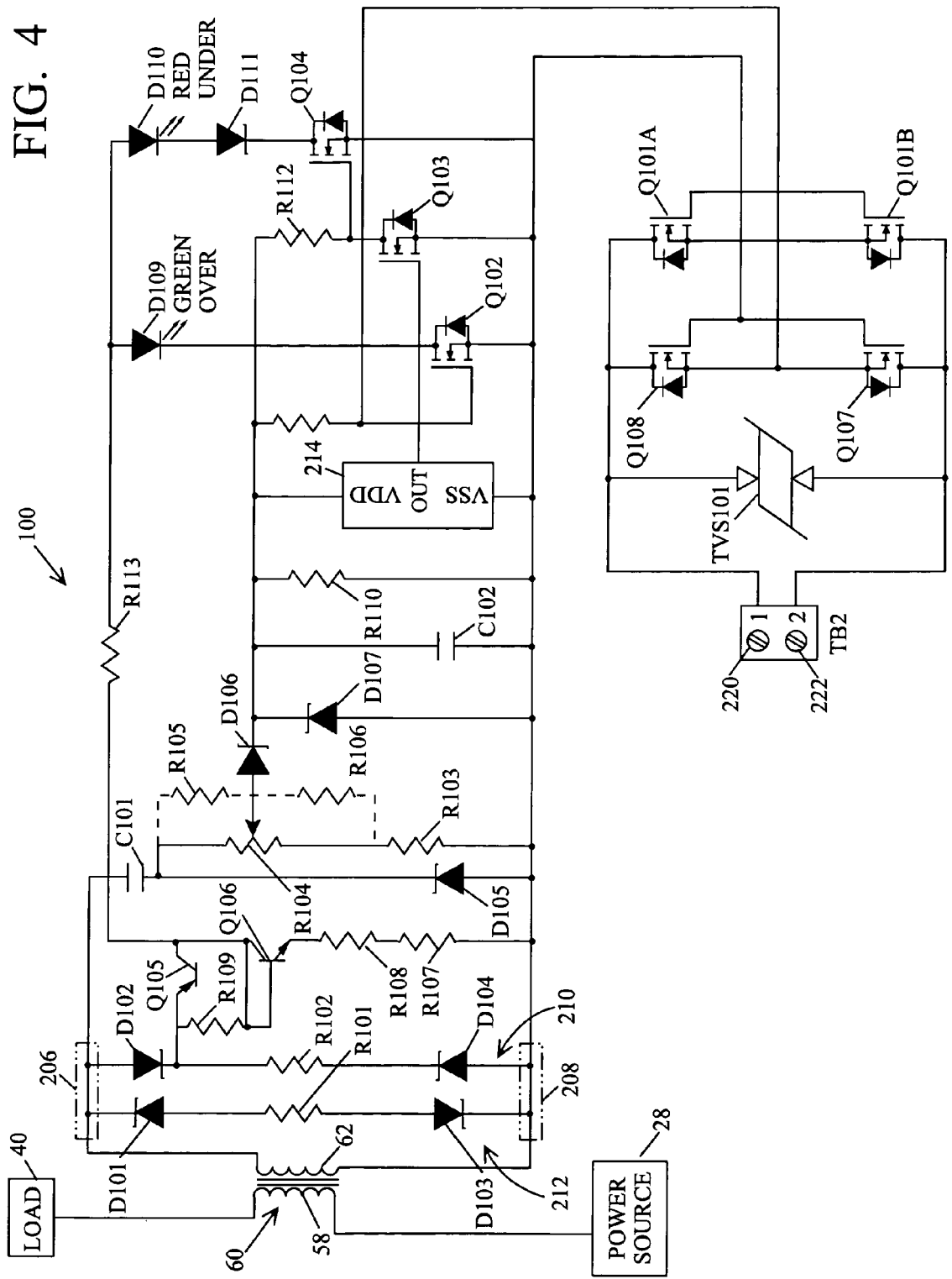
FIG. 4 is schematic diagram of an improved status indicator comprising a current sensor and a current switch.

Referring to FIG. 4, an exemplary improved status indicator 100 comprises a current transformer 60 including a secondary winding 62, a magnetic core and a primary winding 58 which commonly comprises a power cable connecting a load 40 and a power source 28. The secondary winding 62 terminates at a pair of output terminals 206, 208. A positive alternation current transformer burden 210 comprising diodes D102 and D104 and the resistor R102 connect the output terminals of the secondary winding. A negative alternation current transformer burden 212 comprising diodes D101 and D103 and a resistor R101 is also connected across the secondary winding of the current transformer. Separation of the burden imposed on the current transformer during the positive and negative alternations of the signal in the secondary winding enables balancing of the load on the transformer during the respective alternations to compensate for secondary loading, such as the current for status indicator LEDs, and limiting a DC bias which may cause saturation of the core of the current transformer.

A diode D106 in conjunction with a capacitor C102 comprises a half-wave voltage rectifier that provides a DC voltage signal to the precision voltage detector 214. A resistor R110 connected in parallel with the capacitor C102 controls the peak voltage of the ripple on the rectified DC voltage signal output by the rectifier smoothing the rectifier's output. A scaling resistor R103 and a potentiometer R104 regulate the voltage at the base of the diode D106 and enable adjustment of the relationship of the rectifier output voltage to the current in the primary winding. If adjustment is unnecessary, the potentiometer can be replaced by a pair of fixed resistors R105, R106. A diode D107 limits the voltage of the rectifier output to protect the precision voltage detector.

To increase the sensitivity of the status indicator, the status indicator includes an AC voltage signal pickoff and level shifter comprising capacitor C101 and diode D105 to introduce a DC offset to the output signal of the secondary winding. The DC offset shifts the reference of the AC signal to the ground voltage, increasing the mean amplitude of the AC signal. To maximize the signal at the input to the rectifier and the signal to the precision voltage detector, the level shifter preferably shifts the reference voltage so the mean value of the AC signal input to the rectifier is substantially equal to the peak voltage of the AC secondary winding output signal.

Referring also to FIG. 3, the precision voltage detector (PVD) 214 interconnects its input and its output as long as the input voltage (VDD), the rectifier output voltage, remains above a detection voltage ($V_{DETECT}$). With the output of the precision voltage detector high, the transistor Q102 conducts enabling illumination of the green light emitting diode (LED) D109 indicating that current is flowing to the load. The high voltage at the gate of the transistor Q103 shorts the gate of the transistor Q104 to ground preventing illumination of the red LED D110. The high voltage at the gates of the transistors Q101A, Q101B causes the transistors to conduct, shorting the output terminals 220, 222 which may be conductively connected to an annunciator at a remote monitoring station and/or a controller. The transient voltage suppressor TVS101 protects the output portion of the circuit from high transient voltages.

If the rectifier output voltage (VDD), the input voltage to the precision voltage detector, drops below the detection voltage ($V_{DETECT}$), the precision voltage detector interconnects the system ground voltage (VSS) to the output. If the input voltage (VDD) of the precision voltage detector drops even further, below a minimum operating voltage, the output voltage may be an indeterminate voltage somewhere between VDD and VSS. When the voltage at the output of the precision voltage detector is low, the transistor Q102 does not conduct causing the LED D109 to be extinguished. Likewise, the low voltage at the gate of the transistor Q103 causes the transistor to stop conducting, increasing the gate voltage of the transistor Q104, causing the transistor to conduct and enabling illumination of the red LED D110. The low voltage at the gates of the transistors Q101A, Q101B, causes the transistors to stop conducting, opening the conductive interconnection between the output terminals to provide a second signal to the remote monitor and/or controller.

If the rectifier output voltage (VDD) rises again to the release voltage ($V_{RELEASE}$), the precision voltage detector reconnects the input voltage (VDD) to its output. With output of the precision voltage detector high, the transistors Q101A, Q101B, Q102 and Q103 resume conducting, shorting the output terminals, illuminating the green LED D109 and extinguishing the red LED D110.

The current switch of the status indicator, as described, above implements a normally open output. If the transistors Q101A and Q101B are replaced with transistors Q107 and Q108, the status indicator will have a normally closed output, that is, the output terminals will be connected when the output of the precision voltage detector is low (monitored circuit is open) and disconnected when the output of the precision voltage detector is high (monitored circuit is closed).

Power for secondary loads, such as the status indicator LEDs D109 and D110, is provided by a voltage to current converter. During the positive alternation of the AC current in the secondary winding, current flows through the diode D102 and the transistor Q105 to the status indicator LEDs D109 and D110. The flow of current to the status indicator is regulated by the voltage of secondary winding signal and, more specifically, by the transistor Q106 and the resistors R109, R108, R107 and R113. The regulated voltage to current converter linearizes the status indicator LED current as a function of the peak voltage of the positive alternation and equalizes the currents to the two LEDs independent of the respective forward voltage of the respective LEDs. The regulated voltage to current converter prevents uneven loading of the current transformer due to the differing forward voltages of the two status indicator LEDs and substantially reduces the hysteresis of the status indicator.

The sensitivity and accuracy of the status indicator is substantially improved by shifting the reference level of the transformer output to maximize the rectifier output and by reducing the hysteresis of the device by balancing the burden of the current transformer through separate burdens for the positive and negative alternations of the AC signal and by balancing the loading imposed by the status indicator LEDs with a voltage to current converter to supply voltage regulated current for the status indicator LEDs.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

The invention claimed is:

1. A device for monitoring a power cable current, said device comprising:
 (a) a primary transformer winding arranged to conduct said power cable current;
 (b) a secondary transformer winding coupled to said primary transformer winding and electrically interconnecting a first output terminal and a second output terminal, said power cable current inducing in said secondary winding an alternating secondary winding voltage;

(c) a first burden electrically interconnecting said first output terminal and said second output terminal during a positive alternation of said secondary winding voltage; and (d) a second burden electrically interconnecting said second output terminal and said first output terminal during a negative alternation of said secondary winding voltage.

2. The device for monitoring a power cable current of claim 1 further comprising:
   (a) a voltage to current converter responsive to an amplitude of said secondary winding voltage to regulate a converter output current;
   (b) a first light source electrically connected to said voltage to current converter and illuminable by said converter output current in response to a first amplitude of said secondary winding voltage; and
   (c) a second light source electrically connected to said voltage to current converter and illuminable by said converter output current in response to a second amplitude of said secondary winding voltage.

3. A device for monitoring a power cable current, said device comprising:
   (a) a switch including a first switch terminal and a second switch terminal, said switch responsive to a first switch signal to electrically interconnect said first switch terminal and said second switch terminal and responsive to a second switch signal to electrically disconnect said first switch terminal from said second switch terminal;
   (b) a voltage detector electrically connected to said switch and responsive to a detector input voltage, said voltage detector outputting said first switch signal in response a first detector input voltage and outputting said second switch signal in response to a second detector input voltage;
   (c) a rectifier electrically connected to communicate said detector input voltage to said voltage detector, said rectifier converting an AC rectifier input voltage signal to said detector input voltage;
   (d) a voltage reference shifter electrically connected to communicate said AC rectifier input voltage signal to said rectifier; said voltage reference shifter altering a mean amplitude of an AC transformer voltage signal to produce said AC rectifier input voltage signal; and
   (e) a transformer including a secondary winding electrically interconnecting a first transformer output terminal and a second transformer output terminal and electrically connected to communicate said AC transformer voltage signal to said voltage reference shifter, said secondary winding electromagnetically coupled to said power cable, said power cable current inducing in said secondary winding an AC transformer voltage signal representative of said power cable current.

4. The device for monitoring a power cable current of claim 3 wherein said AC rectifier input voltage signal has a mean amplitude substantially equal to a peak voltage of said AC transformer voltage signal.

5. The device for monitoring a power cable current of claim 3 further comprising:

(a) a first burden electrically interconnecting said first transformer output terminal and said second transformer output terminal during a positive alternation of said AC transformer voltage signal; and
(b) a second burden electrically interconnecting said second output terminal and said first output terminal during a negative alternation of said AC transformer voltage signal.

6. The device for monitoring a power cable current of claim 5 further comprising:
   (a) a voltage to current converter responsive to an amplitude of said AC transformer voltage signal to regulate a converter output current;
   (b) a first light source electrically connected to said voltage to current converter, said switch enabling illumination of said first light source by said converter output current when said first switch terminal is electrically interconnected to said second switch terminal; and
   (c) a second light source electrically connected to said voltage to current converter, said switch enabling illumination of said second light source by said converter output current when said first switch terminal is electrically disconnected from said second switch terminal.

7. The device for monitoring a power cable current of claim 3 further comprising:
   (a) a voltage to current converter responsive to an amplitude of said AC transformer voltage signal to regulate a converter output current;
   (b) a first light source electrically connected to said voltage to current converter, said switch enabling illumination of said first light source by said converter output current when said first switch terminal is electrically interconnected to said second switch terminal; and
   (c) a second light source electrically connected to said voltage to current converter, said switch enabling illumination of said second light source by said converter output current when said first switch terminal is electrically disconnected from said second switch terminal.

8. A device for monitoring a power cable current, said device comprising:
   (a) a primary transformer winding arranged to conduct said power cable current;
   (b) a secondary transformer winding coupled to said primary transformer winding, said power cable current inducing in said secondary winding a secondary winding voltage signal;
   (c) a voltage to current converter responsive to an amplitude of said secondary winding voltage to regulate a converter output current;
   (d) a first light source electrically connected to said voltage to current converter and illuminable by said converter output current in response to a first amplitude of said secondary winding voltage signal; and
   (e) a second light source electrically connected to said voltage to current converter and illuminable by said converter output current in response to a second amplitude of said secondary winding voltage signal.

* * * * *